United States Patent
Werelius et al.

(10) Patent No.: US 8,428,895 B2
(45) Date of Patent: Apr. 23, 2013

(54) SYSTEM AND METHOD FOR POWER SYSTEM PARAMETER MEASUREMENT

(75) Inventors: Nils Peter Werelius, Brottby (SE); Mats Gunnar Ohlen, Stockholm (SE)

(73) Assignee: AVO Multi-Amp Corporation, Dallas, TX (US)

( * ) Notice: Subject to any disclaimer, the term of this patent is extended or adjusted under 35 U.S.C. 154(b) by 1084 days.

(21) Appl. No.: 12/259,832

(22) Filed: Oct. 28, 2008

(65) Prior Publication Data

US 2010/0106435 A1   Apr. 29, 2010

(51) Int. Cl.
*G01R 21/00* (2006.01)
*G06F 11/30* (2006.01)

(52) U.S. Cl.
USPC ............ 702/60; 702/61; 702/182; 702/183

(58) Field of Classification Search .......... 702/117–123, 702/182–189, 60–68; G01R 21/00; G06F 11/30
See application file for complete search history.

(56) References Cited

U.S. PATENT DOCUMENTS 3,667,034 A * 5/1972 Freeze ........................ 324/547
4,757,263 A * 7/1988 Cummings et al. ........... 324/552

OTHER PUBLICATIONS

Buxkemper, Bruce Andrew; U.S. Appl. No. 12/184,962; "System and Method for Power System Component Testing," filed Aug. 1, 2008; Specification 35 pgs; Drawing Sheets: (Figs. 1-5).
Gafvert, Uno, et al, "Dielectric Spectroscopy in Time and Frequency Domain Applied to Diagnostics of Power Transfomers," 6th International Conference on Properties and Application of Dielectric Materials; Xi'an Jiatong University, Xi'an, China; Jun. 2000; (6 pgs).

* cited by examiner

*Primary Examiner* — Phuong Huynh
(74) *Attorney, Agent, or Firm* — Conley Rose, P.C.; J. Robert Brown, Jr.

(57) ABSTRACT

A system and method of testing a power system component is disclosed. The system and method comprises coupling a test set to the power system component and stimulating the power system component with a frequency sweep signal. The method also comprises capturing a response of the power system component to the frequency sweep signal, wherein the response relates to frequency and mapping the response to an estimated response, wherein the estimated response relates to temperature. The method also comprises evaluating the power system component based on the estimated response.

20 Claims, 6 Drawing Sheets

Unit under test operated at constant temperature

Unit under test operated at constant frequency

SYSTEM AND METHOD FOR POWER SYSTEM PARAMETER MEASUREMENT

CROSS-REFERENCE TO RELATED APPLICATIONS

None.

STATEMENT REGARDING FEDERALLY SPONSORED RESEARCH OR DEVELOPMENT

Not applicable.

REFERENCE TO A MICROFICHE APPENDIX

Not applicable.

BACKGROUND

The electrical power system in the United States generates three-phase alternating current (AC) electrical power. Each power phase is 120 degrees out of phase, plus or minus, with the other two power phases. The voltage of any phase oscillates sinusoidally between positive voltage and negative voltage. It happens that three-phase electrical power generation, transmission, and distribution provides an acceptable compromise between the efficiency, expense, and complexity of power system equipment.

It is more efficient to transmit electrical power at high voltage levels than at low voltage levels. Electrical power may be generated as three-phase AC power at moderate voltage levels in the 12 thousand volt (kV) to 25 kV range. The voltage level may be stepped up to the 110 kV to 1000 kV range using a transformer for transmission over long transmission lines, hence minimizing transmission line power loss. The transmission line voltage may be stepped down, using a transformer at a substation, to the 12 kV to 35 kV range for local distribution. The local distribution voltage level may be further stepped down through one or more transformer stages to provide 120 volt AC power to the home and office. Special accommodations may be made for manufacturing plant electrical power consumers. In some contexts, the electrical power system may be abstractly categorized into electrical power generation, electrical power transmission over extended distances, and electrical power distribution to electrical power consumers.

Power system transformers may comprise three pairs of wire windings, one pair of windings for each phase. Each pair of wire windings is constructed so that an alternating electric current in a primary winding creates a fluctuating electromagnetic field that couples into the secondary winding, thereby inducing a corresponding alternating electric current in the secondary winding. Typically the primary and secondary windings are wound on a common core that improves the efficiency of the transformer by concentrating the electromagnetic field within the common core, thereby improving the coupling between the primary and secondary windings. In an ideal transformer, the voltage in the secondary winding $V_s$ is proportional to the voltage in the primary winding $V_p$, where the proportionality is mediated by the ratio of the number of wire turns in the secondary winding $N_s$ to the number of wire turns in the primary winding $N_p$: $V_s = V_p(N_s/N_p)$. In an ideal transformer, the current in the secondary winding $I_s$ is proportional to the current in the primary winding $I_p$, where the proportionality is mediated by the ratio of the number of wire turns in the primary winding $N_p$ to the number of wire turns in the secondary winding $N_s$: $I_s = I_p(N_p/N_s)$. The performance of power system transformers may change as insulation of the windings deteriorates. This deterioration may lead to a dissipation factor (DF) that is greater than zero. In some contexts, the dissipation factor may be referred to as the insulation power factor. In practical power system components, the dissipation factor is greater than zero, but by a tolerable fraction of a percent. For example, a dissipation factor value at 20 degrees C. for a new power distribution transformer winding may be about 0.001. A dissipation factor value of 0.01 may be grounds for an alert or warning.

The ratio of number of turns in the secondary winding and the number of turns in the primary winding may change if a turn shorts at a point of insulation breakdown. A wide variety of power system transformer configurations is known, and some transformers may vary somewhat from the general description above. Some transformers may be single-phase transformers. Some transformers may be auto-transformers. Some transformers may have taps. The external connections to power distribution transformer windings may be provided via bushings. In some embodiments, bushings include ceramic insulators.

Testing of power system transformers may be conducted by connecting a test set to the windings of the power system transformers and exciting the primary winding and the secondary winding with electrical signals, both direct current and alternating current. Testing may be conducted on one transformer phase at a time, or may be conducted on multiple transformer phases concurrently. From some points of view, testing generators has some similarities to testing transformers. An exciter winding in a generator may be considered to be similar, in some respects, to a transformer winding. The windings of a generator may be considered to be similar, in some respects to a transformer winding. Transporting the power system transformer or generator to a controlled test laboratory environment may not be economically feasible, and therefore testing typically occurs on site, often outdoors in variable weather conditions. As can readily be appreciated by one skilled in the power distribution art, the testing environment associated with high voltage power system transformers may be subject to intense electric field fluxes as well as high levels of air borne dust and grit.

SUMMARY

In an embodiment, a system and method of testing a power system component is disclosed. The system and method comprises coupling a test set to the power system component and stimulating the power system component with a frequency sweep signal. The method also comprises capturing a response of the power system component to the frequency sweep signal, wherein the response relates to frequency and mapping the response to an estimated response, wherein the estimated response relates to temperature. The method also comprises evaluating the power system component based on the estimated response.

In another embodiment, a test set is disclosed. The test set comprises at least a first stimulator circuit to stimulate an electrical power system component with a frequency sweep signal, wherein the voltage of the frequency sweep signal is a voltage of less than about 1,400 peak volts, and at least a first detector circuit to detect a response of the electrical power system component to the frequency sweep signal. The test set also comprises a test controller to convert the response to a mapping of a temperature to a parameter of the electrical power system component at a substantially constant frequency and to evaluate the power system component based on the mapping of the temperature to the parameter, where the parameter is at least one of an insulation power factor, a dissipation factor, a capacitance, a permittivity, and a susceptibility.

In another embodiment, a method of testing a power system component is disclosed. The method comprises applying a first test signal at a first test frequency to the power system component and detecting a response to the first test signal from the power system component. The method also comprises applying a second test signal at a second test frequency to the power system component and detecting a response to the second test signal from the power system component. The method also comprises converting the response to the first test signal to a first parameter of the power system component at a substantially constant frequency at a first temperature and the response to the second test signal to a second parameter at the substantially constant frequency at a second temperature and evaluating the power system component at least in part based on the first parameter at the substantially constant frequency at the first temperature and on the second parameter at the substantially constant frequency at the second temperature, wherein the parameter is at least one of an insulation power factor, a dissipation factor, a capacitance, a permittivity, and a susceptibility.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1:
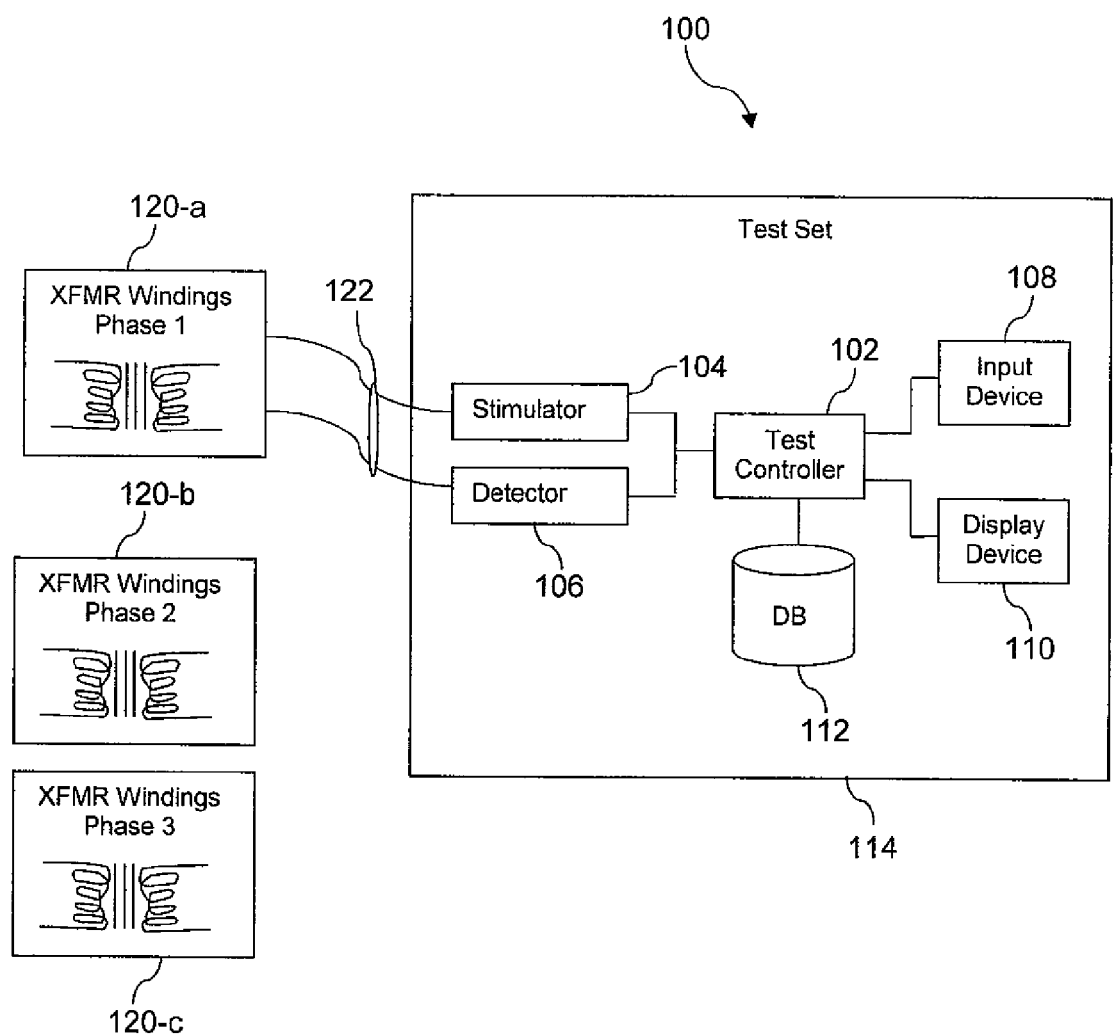
FIG. 1 is a block diagram of a test set according to an embodiment of the disclosure.

It should be understood at the outset that although illustrative implementations of one or more embodiments are illustrated below, the disclosed systems and methods may be implemented using any number of techniques, whether currently known or in existence. The disclosure should in no way be limited to the illustrative implementations, drawings, and techniques illustrated below, but may be modified within the scope of the appended claims along with their full scope of equivalents.

The dissipation factor (DF) and/or insulation power factor of an electrical power system component is a measure of insulator loss-rate of power. In some contexts the insulation power factor may be referred to as the dissipation factor of the insulation of an electrical power system component. The electric power lost in a power system component is primarily lost in the form of heat. It is desirable to keep insulation power factor at a low level in power system components to avoid waste and to operate at maximum efficiency. Additionally, it is important to keep insulation power factor at a low level to avoid excessive heat in the power system components which may prematurely degrade and/or destroy the power system components. In extreme cases, excessively high insulation power factor may cause thermal runaway. The dissipation factor may be determined as the loss tangent as the ratio of the resistance to the reactance of the power system component:

$$\text{Tan } \delta = \text{dissipation factor} = R/X$$

where R represents resistance and X represents the reactance of the power system component. The related insulation power factor may be determined as the ratio of the resistance to the amplitude of the impedance of the power system component:

$$\text{insulation power factor} = R/\{SQRT(SQR(R)+SQR(X))\}$$

It can readily be appreciated that for small values of dissipation factor, the dissipation factor is approximately equivalent to the insulation power factor. Insulation power factor may change with the temperature of the power system component, typically increasing at higher temperatures. Additionally, insulation power factor may change with aging of the power system component, for example as insulation materials degrade over time, typically increasing with age. The insulation power factor may change as a result of excessive moisture, for example a moisture content in a bushing or a moisture content in insulation of a transformer winding. When a power system component is new, the insulation power factor typically does not change significantly with increased temperatures. With increased age, however, the insulation power factor often changes more with increased temperature.

Manufacturers of electrical power distribution transformers and bushings may provide data representing the insulation power factor of their components at different operating temperatures. This data, however, typically applies to new components. After components have been in operation for a period of time, the materials begin to break down and the insulation power factor can no longer be assumed to follow the data provided by the manufacturers. The procedure is to determine, such as by testing, the insulation power factor of the component at a plurality of different operating temperatures that may be experienced in a production environment, for example to determine insulation power factor at each of 20° C., 25° C., 30° C., 35° C., 40° C., 45° C., 50° C., 55° C., 60° C., 65° C., and 70° C. The resultant information can then be used to predict insulation power factor during day-to-day operation at different operating temperatures. If the insulation power factor is excessive, it is recommended that the power system component be taken out of service and maintained, for example refurbishing the component or decommissioning the component. Performing this kind of controlled temperature test for electrical power system components, however, is very difficult if not impracticable.

A method and system for determining the values of a characteristic parameter of a power system component at a range of different temperatures without actually measuring the parameter value of the power system component at those temperatures is disclosed. The general approach is to test the power system component using dielectric frequency response (DFR) measurements of the subject parameter and then to map the results to present the parameter as a function of temperature. This method and system may be applied to testing transformer winding insulation, transformer bushings, rotating machines, instrument transformers, high voltage cables, and a variety of high voltage apparatus with minor adjustments readily supplied, in combination with the present disclosure, by those skilled in the art. The power system component is stimulated by a test set with a test signal that sweeps through a range of frequencies to determine the impedance of the power system component at a constant temperature at each of the several frequencies. The impedance can be used to calculate the dissipation factor, the insulation power factor, the capacitance, and other parameter values of the power system component. The subject parameter, for example insulation power factor, is taken as a dependent variable related to frequency as the independent variable at a constant temperature. The parameter versus frequency data is then mapped to the parameter versus temperature data at a constant frequency according to a mathematical relationship described below. For example, insulation power factor versus frequency data is mapped to insulation power factor versus temperature at a constant frequency. The constant frequency is the nominal operating frequency of the subject electrical power system component, for example about 60 Hz or about 50 Hz, which may be referred to as the line frequency of the power distribution system. Other line frequencies are known, for example 16⅔ Hz, 25 Hz, 400 Hz, and other frequencies, and it is contemplated that the test set 100 may also support one or more of these other line frequencies.

The test set may be self-contained, that is the stimulation circuitry, detection circuitry, control component, input component, and display component may all be contained within a single case. The test set may be ruggedized and shielded appropriately to provide good service in the harsh electrical environment of a power generation and/or power distribution station and exposed to the weather. The test set operation may be controlled using the input component. Results of the test may be displayed by the display component. Results may also be stored in a database for comparison with later test results. The test set may be optionally coupled to a printer at the test location, and the test results may be printed out on-location and left with the electrical power operating company. In some contexts, the electrical power operating company may be referred to as the electrical power utility company.

Turning now to FIG. 1, an electrical power system component test set 100 is described. The test set 100 comprises a test controller 102, a stimulator circuit 104, a detector circuit 106, an input device 108, a display device 110, and an optional database 112. In some embodiments three independent stimulator circuits and three independent detector circuits may be provided, for example for convenience in testing three-phase electrical power system components without reconnecting testing harness apparatus. In an embodiment, the test set 100 is enclosed within a case 114 that includes electrical shielding.

The test set 100 may be connected to a first transformer 120-*a* using a harness 122. A variety of harness configurations are possible, all of which are contemplated by the present disclosure. For example, in an embodiment comprising three independent stimulator circuits and three independent detector circuits, three separate harnesses 122 may be employed to connect to the first transformer 120-*a*, a second transformer 120-*b*, and a third transformer 120-*c*. Alternatively, the three transformer windings may be tested independently, one winding after the other. The three transformer windings 120-*a*, 120-*b*, and 120-*c* may be viewed as three single-phase transformers and herein after will be referred to as the first transformer 120-*a*, the second transformer 120-*b*, and the third transformer 120-*c*. The harness 122 may be connected to the first transformer 120-*a*, to the stimulator circuit 104, and to the detector circuit 106, and the first transformer 120-*a* may then be tested. Thereafter the harness 122 may be disconnected from the first transformer 120-*a* and connected to the second transformer winding, and the second transformer 120-*b* may then be tested. Thereafter the harness 122 may be disconnected from the second transformer 120-*b* and connected to the third transformer 120-*c*, and the third transformer 120-*c* may then be tested.

While three separate transformer windings 120 are depicted in FIG. 1, the test set 100 is operable to test transformers having other numbers of transformer windings 120 and other configurations of transformer windings 120. For example, practical three-phase transformers may have a first ground tap that is shared among the three windings of the primary and a second ground tap that is shared among the three windings of the secondary.

The stimulator circuit 104 stimulates or excites the power system component under test with a stimulation signal. For example, the stimulator circuit 104 may generate an alternating current (AC) voltage signal to stimulate the first transformer 120-*a*. The stimulator circuit 104 may sweep the frequency of the stimulation signal from a first AC frequency to a second AC frequency. For example, in an embodiment, the stimulator circuit 104 may generate a 600 Hz signal for five seconds, the detector circuit 106 may measure the response of the component; the stimulator circuit may generate a 240 Hz signal for five seconds, the detector circuit 106 may measure the response; the stimulator circuit may generate a 120 Hz signal for five seconds, the detector circuit 106 may measure the response; the stimulator circuit may generate a 60 Hz signal for five seconds, the detector circuit 106 may measure the response, and so on, sweeping the frequency of the stimulation signal from about 600 Hz to about 0.006 Hz, testing three data points per frequency decade. At lower frequencies, for example less than about 0.6 Hz, the stimulation signal may be maintained for longer than five seconds, for example up to about eighteen minutes for 0.001 Hz. In another embodiment, the stimulation signal may be swept from a low frequency to a high frequency. In a region where the electrical power distribution system operates at about 50 Hz, the stimulation signal may range from about 1 KHz to about 0.001 Hz, testing three data points per frequency decade. In another embodiment more than three data points per frequency decade may be tested. In another embodiment, some other pattern of sweeping the frequency of the stimulation signal may be employed. Additionally, in another embodiment, some other effective time duration for maintaining the stimulation signal at a frequency may be employed.

In an embodiment, in addition to stimulating the power system component with three frequencies per decade, the stimulator circuit 104 may also stimulate the power system component at one or more specific frequencies of interest, for example at specific frequencies that correspond to or may be mapped to specific operating temperatures of interest, for example a specific frequency of about 6.2 Hz that may map to an operating temperature of about 20° C. In an embodiment, in addition to stimulating the power system component with three frequencies per decade, the stimulator circuit 104 may also stimulate the power system component at specific frequencies corresponding to operating temperatures of each of 0° C., 5° C., 10° C., 15° C., 20° C., 25° C., 30° C., 35° C., 40° C., 45° C., 50° C., 55° C., 60° C., 65° C., and 70° C. In an embodiment, in addition to stimulating the power system component with three frequencies per decade, the stimulator circuit 104 may also stimulate the power system component at a specific frequency corresponding to an operating temperature of about 72° F. In an embodiment, in addition to stimulating the power system component with three frequencies per decade, the stimulator circuit 104 may also stimulate the power system component at specific frequencies corresponding to operating temperatures of each of 30° F., 40° F., 50° F., 60° F., 70° F., 80° F., 90° F., 100° F., 110° F., 120° F., 130° F., 140° F., 150° F., and 160° F. It is understood that stimulation signals at other frequencies corresponding to other specific temperatures of interest may be generated.

In an embodiment, rather than stimulating the power system component with three frequencies per decade, the stimulator circuit 104 may stimulate the power system component at specific frequencies corresponding to operating temperatures of each of 0° C., 5° C., 10° C., 15° C., 20° C., 25° C., 30° C., 35° C., 40° C., 45° C., 50° C., 55° C., 60° C., 65° C., and 70° C. In an embodiment, rather than stimulating the power system component with three frequencies per decade, the stimulator circuit 104 may stimulate the power system component at specific frequencies corresponding to operating temperatures of each of 30° F., 40° F., 50° F., 60° F., 70° F., 80° F., 90° F., 100° F., 110° F., 120° F., 130° F., 140° F., 150° F., and 160° F. It is understood that stimulation signals at other frequencies corresponding to other specific temperatures of interest may be generated.

In an embodiment, the stimulator circuit 104 may generate the stimulation signal as a low voltage signal, for example a voltage signal with a peak voltage of less than about 1,400 volts. In an embodiment, the stimulator circuit 104 may generate the stimulation signal as a voltage signal with a peak voltage of about 200 volts, which may be referred to in some contexts as about 200 peak volts. Many other stimulation signals may be generated by the stimulator circuits 104, all of which are contemplated by the present disclosure. The stimulation signals may also be referred to as test signals.

The detector circuit 106 detects, records, and/or measures the response of the transformer 120 to the stimulation signal output by the stimulator 104. The detector circuit 106 may include one or more analog-to-digital converters to periodically capture the voltage and/or current of an output of the transformer 120 and other circuitry to store the digital values in a memory. In an embodiment, the detector circuit 106 may include other circuitry or processing functionality to analyze the captured response to determine a test result parameter, for example a resistance of a winding of the transformer 120, an impedance of a winding of the transformer 120, an impedance of a transformer insulation, a dissipation factor (DF) of the transformer insulation, an insulation power factor of the transformer insulation, a capacitance of the transformer insulation, a permittivity of the transformer insulation, a susceptibility of the transformer insulation, a dissipation factor of the transformer 120, an insulation power factor of the transformer 120, a capacitance of the transformer 120, a permittivity of the transformer 120, a susceptibility of the transformer 120, and other parameter values. Alternatively, in another embodiment, the detector circuit 106 provides unprocessed data to the test controller 102, and the test controller 102 analyzes the unprocessed data to determine the test result parameter. For example, the detector circuit 106 may provide data pairs of voltage value and current value to the test controller 102, and the test controller may analyze this data to determine the related parameter values.

The test controller 102 conducts the test of the power system transformer by controlling the stimulator circuit 104 and the detector circuit 106. The test controller 102 receives inputs from the input device 108 that the test controller 102 uses to define test values and/or parameter values to command the stimulator circuit 104. In an embodiment, the inputs may be in the form of alphanumeric text entered into fields of a test form that is displayed on the display device 110. Alternatively, the inputs may be at least partly in the form of selections of menu drop-down buttons. The inputs may define an operating temperature of the power system component under test, for example the transformer 120, and/or an ambient temperature of the environment surrounding the power system component under test. The inputs may also define a normal operating frequency and/or a line frequency for the power system component under test, for example about 60 Hz or about 50 Hz. The test controller 102 also receives inputs from the input device 108 to command test state transitions, for example a start command, a stop command, a repeat command, and other such commands.

The test controller 102 maps the parameter versus frequency data set at a constant temperature obtained from testing the power distribution component to the parameter versus temperature data set at a constant frequency. For example, the insulation power factor versus frequency data set at a constant temperature may be obtained from testing the transformer 120 and mapped by the test controller 102 to the insulation power factor versus temperature data set at the line frequency. This mapping will be discussed in more detail hereinafter. In an embodiment, the insulation power factor versus temperature data set at a constant frequency is the data set that may be customarily used to evaluate the condition of the power system component. In other embodiments, however, other parameters may be used singly or in combination with other parameters to evaluate the condition of the power system component. The test controller 102 may access the test results database 112 to store results of testing and to read test results from earlier tests.

The input device 108 may be a keyboard and/or keypad and/or touchscreen. The input device 108 may also comprise one or more switches and/or pushbuttons. The display device 110 may be a flat panel display, a liquid crystal display (LCD), or other display. In an embodiment, the input device 108 comprises a QWERTY keyboard, including roman numeral keys 1 through 9 and 0, a test button, a five button navigation pad, a home key, a zone key, a power suspend key, a help function key, an information key, and a function key. The QWERTY keyboard is used for entry of alphanumeric and other input, for example data and notes. The test button is used to initiate and terminate testing. The five button navigation pad is used to move a display cursor left/right and up/down and to activate a selection, for example to navigate through cells or fields of a test form. The zone key selects an active region of the display device 110. The help function key selects on-screen Help to assist an operator of the test set 100. The information key selects on-screen information to assist an operator of the test set 100. The function key displays the options available for any selection highlighted on the display device 110. In other embodiments, however other input functions and other input keys, switches, or devices may be used by the test set 100.

The case 114 may be a ruggedized plastic case that is designed to absorb and dampen mechanical disturbances, for example bumps or jars from metal tools or falls onto concrete. In an embodiment, the case 114 includes electrical shielding to protect the components of the test set 100 from the strong electromagnetic fields and/or electric fields that may be experienced at electrical power system locations, for example at electrical power generating stations and/or electrical power distribution stations. In an embodiment, the case 114 is designed to contain the harness 122 when closed. Further details about a test set suitable for some embodiments of the present disclosure may be found in U.S. patent application Ser. No. 12/184,962 filed Aug. 1, 2008, entitled "System and Method for Power System Component Testing," by Bruce Andrew Buxkemper, et al., which is hereby incorporated by reference.

The test set 100 may be coupled to local AC power, for example 120 VAC power or 220 VAC power. The test set 100 may be coupled to a printer at the test location, in the field, to print out test results on location, while the test set 100 remains coupled to the power system component under test. This may have multiple benefits, including providing the operator of the test set 100 with an opportunity to carefully review the test results to assure that the test has completed and all essential test result parameters have been determined. If some test result parameters remain undetermined, the operator may resume and complete the test. This may save time, money, and damaged business relationships versus needing to schedule a follow-up test. Additionally, the electrical power operating company and/or electrical power utility company may prefer to have the record of the test entered into their notebooks or logs immediately.

It will be appreciated by one skilled in the art that the power system component test set 100 may readily be employed for testing power system components other than power system transformers, including instrument transformers, cables, generators, rotating machines, batteries, protection relays, circuit breakers, and others, in some cases after making appropriate modifications to the stimulator circuit 104 or detector circuit 106 or test controller 102.

Figure 2A:
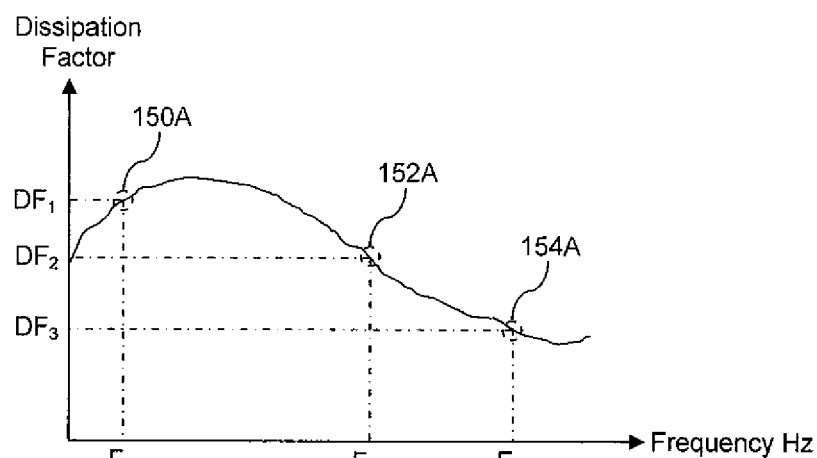
FIG. 2A is an illustration of a dissipation factor versus frequency data set according to an embodiment of the disclosure.
Figure 2B:
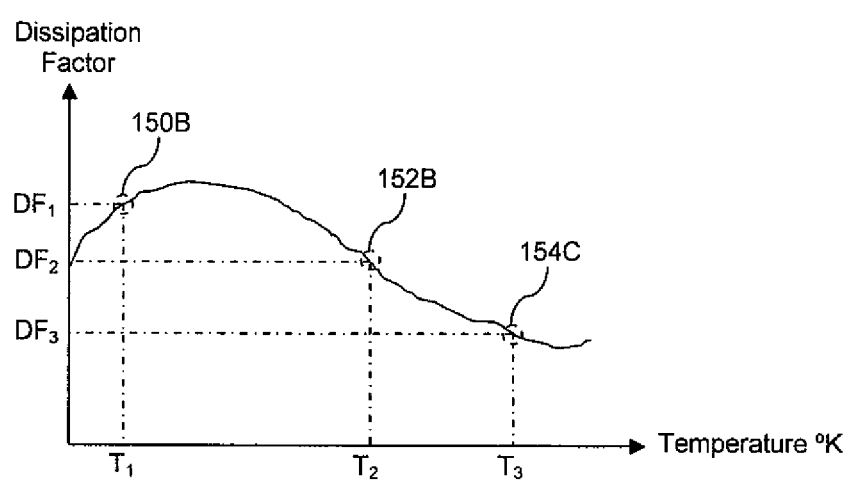
FIG. 2B is an illustration of a dissipation factor versus temperature data set according to an embodiment of the disclosure.

Turning now to FIG. 2A and FIG. 2B, mapping from an insulation power factor versus frequency data set under a constant temperature operating condition to an insulation power factor versus temperature data set under a constant frequency operating condition is described. A plurality of data points defined by paired coordinates of the frequency independent variable and the corresponding Dissipation Factor (DF) dependent variable are shown in FIG. 2A. While represented in FIG. 2A as a continuous curve for purposes of discussion, one skilled in the art will readily appreciate that the data points may comprise a discontinuous curve. The data points of FIG. 2A may be captured by the detector circuit 106 and/or derived by the test controller 102 by analyzing the data captured by the detector circuit 106. The test set 100 may measure the impedance of the device under test, for example a transformer winding insulation or a bushing, based on Ohm's law as impedance equals complex voltage divided by complex current:

$$Z = V/I \qquad (Eq\ 1)$$

where the bold font of the characters indicates the vector and/or complex aspect of the variables. A variety of device parameters can be determined from the complex impedance including $$\text{Dissipation Factor} = \tan \delta = -Re\{Z\}/Im\{Z\} \qquad (Eq\ 2)$$

$$\text{Insulation Power Factor} = Re\{Z\}/|Z| \qquad (Eq\ 3)$$

$$\text{Capacitance} = Re\{1/(j\omega Z)\} = Re\{\text{Complex Capacitance}\} \qquad (Eq\ 4)$$

where $Re\{\ \}$ and $Im\{\ \}$ represent the real component and the imaginary component, respectively, of the subject complex quantity. As is known to those skilled in the art, electrical circuits containing dynamic components that store energy in electric fields and/or magnetic fields (e.g., capacitive components and inductive components) may exhibit phase offsets between oscillating voltage and current, and the phase offsets are commonly represented using complex numbers comprising a real component and an imaginary component. Inspection of Equation 2 and Equation 3 reveal that for small values of dissipation factor, dissipation factor and insulation power factor are approximately equal.

Every data point of FIG. 2A may be mapped to a corresponding data point of FIG. 2B by the mathematical relationship:

$$F_T = F_{TestTemperature} e^{-(E_a/k)(1/T - 1/TestTemperature)} \qquad (Eq\ 5)$$

where k is the Boltzman constant, $E_a$ is the activation energy, TestTemperature is the substantially constant temperature of the power system component under test, T is the independent variable temperature of the insulation power factor versus temperature data set, e is the natural logarithm, $F_{TestTemperature}$ is the independent variable frequency of the insulation power factor versus frequency data set, and $F_T$ is the substantially constant frequency of the power system component under normal operating conditions. The Boltzman constant k is about 8.6174 eV/° K. The activation energy $E_a$ is in the range from about 0.4 eV to about 1.5 eV. The activation energy $E_a$ associated with transformer oils may be about 0.4 eV. The activation energy $E_a$ associated with transformers and bushings may be in the range from about 0.9 eV to about 1.2 eV. The activation energy $E_a$ is a scaling factor and may be determined experimentally by one skilled in the art, for example by measuring a typical sample at different temperatures, shifting frequency to match, and then solve for the parameter based on equation 1 above.

The value of $F_T$ is the normal operating frequency of the power system component under test, for example 60 Hz for the power distribution system in the United States and 50 Hz for the power distribution system in Europe. This may be referred to as the line frequency of the subject power distribution system.

Equation 5 contains two variables, therefore when one of the variables is given a value, the value of the other variable can be readily calculated. For example, given a value of the variable of frequency $F_{TestTemperature}$ corresponding to $F_1$, the second variable T can be determined which corresponds to $T_1$. The test controller 102 may perform the necessary conversions to map the first data pair 150A ($F_1$, $DF_1$) to the corresponding second data pair 150B ($T_1$, $DF_1$), the third data pair 152A ($F_2$, $DF_2$) to the corresponding fourth data pair 152B ($T_2$, $DF_2$), and the fifth data pair 154A ($F_3$, $DF_3$) to the corresponding sixth data pair 154B ($T_3$, $DF_3$). In this way, and in accordance with Equation 5 above, the test controller 102 may map the insulation power factor versus frequency data set to an insulation power factor versus temperature data set. Equation 5 may be restructured as a proportional relationship:

$$F_T \propto F_{TestTemperature} e^{-(K/T)} \qquad (Eq\ 6)$$

where K is a constant of exponentiation equal to $E_a/k$ and T is the independent variable temperature of the insulation power factor versus temperature data set. In an embodiment, for some insulation parameters, the parameter is scaled by a temperature dependent function A(T):

$$\text{Parameter}(F_1, T_1) \propto A(T_1, T_0) \text{Parameter}(F_0, T_0) \qquad (Eq\ 7)$$

where $T_0$ is actual temperature, $T_1$ is mapped temperature, $F_0$ is actual frequency, and $F_1$ is mapped frequency. The scaling factor A(T) may be determined experimentally by one skilled in the art, for example by measuring the parameter at different temperatures, shifting frequency to match, and then solving for the scaling factor, based on Equation 5. In the case of many bushings and transformers, the value of A(T) is approximately equal to unity (1) and is included for theoretical completeness. It is understood that the shapes of the curves represented in FIG. 2A and FIG. 2B may be altered by scaling of the axes of the independent and dependent variables. The approach of mapping a data set of a parameter depending on frequency to a data set of the parameter depending on temperature using the relationship of Equation 5, Equation 6, and/or Equation 7 may be employed for a variety of insulation parameters in addition to the dissipation factor and/or the insulation power factor, for example for capacitance, permittivity, and other parameters.

Figure 2C:
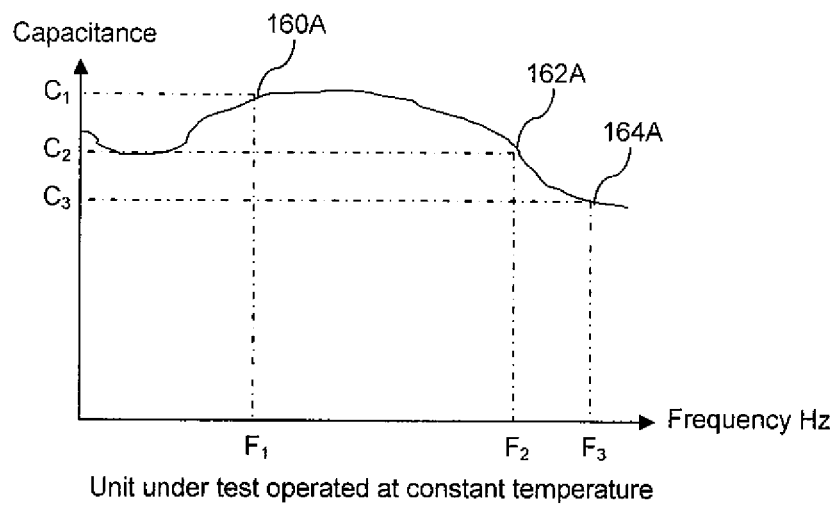
FIG. 2C is an illustration of a capacitance versus frequency data set according to an embodiment of the disclosure.
Figure 2D:
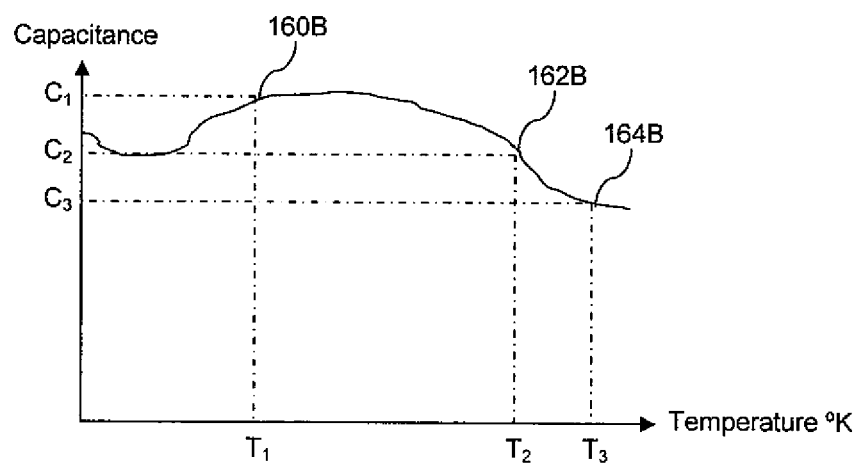
FIG. 2D is an illustration of a capacitance versus temperature data set according to an embodiment of the disclosure.

Turning now to FIG. 2C and FIG. 2D, a mapping of a data set of capacitance versus frequency in the context of constant temperature to a data set of capacitance versus temperature in a context of constant frequency is described. A seventh data point 160A ($F_1$, $C_1$) corresponding to a first capacitance at a first frequency in the context of a constant temperature may be mapped to an eighth data point 160B ($T_1$, $C_1$) the first capacitance at a first temperature at line frequency based on Equation 5 and/or Equation 6. A ninth data point 162A ($F_2$, $C_2$) corresponding to a second capacitance at a second frequency in the context of a constant temperature may be mapped to a tenth data point ($T_2$, $C_2$) the second capacitance at a second temperature at line frequency based on Equation 5 and/or Equation 6. An eleventh data point 164A ($F_3$, $C_3$) corresponding to a third capacitance at a third frequency in the context of a constant temperature may be mapped to a twelfth data point ($T_3$, $C_3$) the third capacitance at a third temperature at line frequency based on Equation 5 and/or Equation 6. It is understood that the data set of capacitance versus frequency at a constant temperature is determined by test, for example using the test set 100 described above. It is understood that the shapes of the curves represented in FIG. 2C and FIG. 2D may be altered by scaling of the axes of the independent and dependent variables.

It will be appreciated by those skilled in the art that testing the power system component using one or more of the frequency sweep stimulation signals described above with reference to FIG. 1 can produce useful mappings of parameters of interest against temperature. By selecting the frequency sweep stimulation signals the mappings can be produced with as more or less accuracy as needed, for example trading off convenience and time invested in testing the power system component against greater accuracy associated with more testing points per frequency decade. The testing frequencies may be selected to map to selected temperatures, thereby providing direct mappings for each of a number of specific temperature data points of interest.

Figure 3:
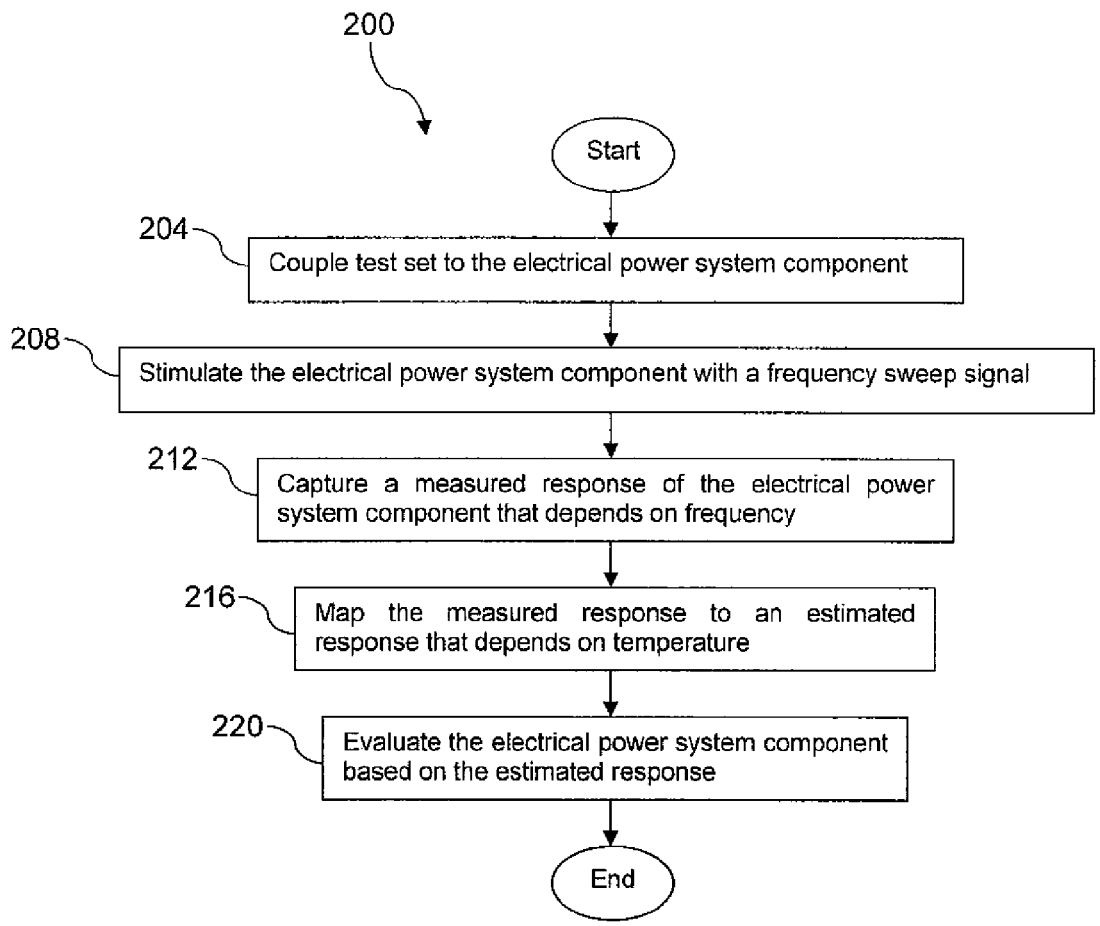
FIG. 3 is a flow diagram of a method of testing a power system component according to an embodiment of the disclosure.

Turning now to FIG. 3 a method 200 of testing an electrical power system component is described. At block 204 the test set 100 is coupled to the electrical power system component. For example, the harness 122 is connected between the test set 100 and the first transformer 120-*a*. At block 208, the test set 100 stimulates the electrical power system component with a frequency sweep signal. In an embodiment, the frequency sweep signal may be generated as a sequence or series of substantially constant frequency signals that are maintained for an effective duration of time, for example five seconds or some other effective time interval, before changing the frequency. For low frequency test signals, for example for test signals having a frequency of less than about 0.6 Hz, the effective duration of time may increase such that the effective duration of time for maintaining a 0.001 Hz stimulation signal may be about eighteen minutes. In an embodiment, the signal may comprise a sinusoidal signal or some other periodic waveform. In an embodiment, the signal is a low voltage signal. In another embodiment, the frequency sweep signal may instead ramp the frequency up at a substantially continuous rate without pausing at any frequency for a time interval.

At block 212, the test set 100 captures a measured response of the electrical power system component, where the measured response depends on frequency. For example, the test set 100 may capture the measured voltage and the measured current of the electrical power system component. Block 208 and block 212 may be performed substantially concurrently. The measured response may be detected and/or measured by the detector circuit 106 and provided to the test controller 102. The test controller 102 may store the measured response in local memory such as random access memory or in the database 112.

At block 216, the measured response is mapped to an estimated response that depends on temperature. For example, the test controller 102 maps insulation power factor versus frequency data pairs at constant temperature to estimated insulation power factor versus temperature data pairs at constant operating frequency according to the relationship described above in Equation 5, Equation 6, and/or Equation 7. In other embodiments, other parameters may be mapped, for example dissipation factor, capacitance, permittivity, susceptibility, and other characteristic operating parameters of the power system component under test.

At block 220, the electrical power system component is evaluated based on the estimated response and/or operating parameter of the power system component, for example, the estimated insulation power factor versus temperature data pairs. For example, if the insulation power factor is too high at some temperature points, the electrical power system component may be removed from service and decommissioned. Alternatively, the electrical power system component may be removed from service and overhauled. In an embodiment, the estimated response may be used as a substitute and/or replacement for manufacturer's data predicting parameter values of the power system component at different temperatures.

Figure 4:
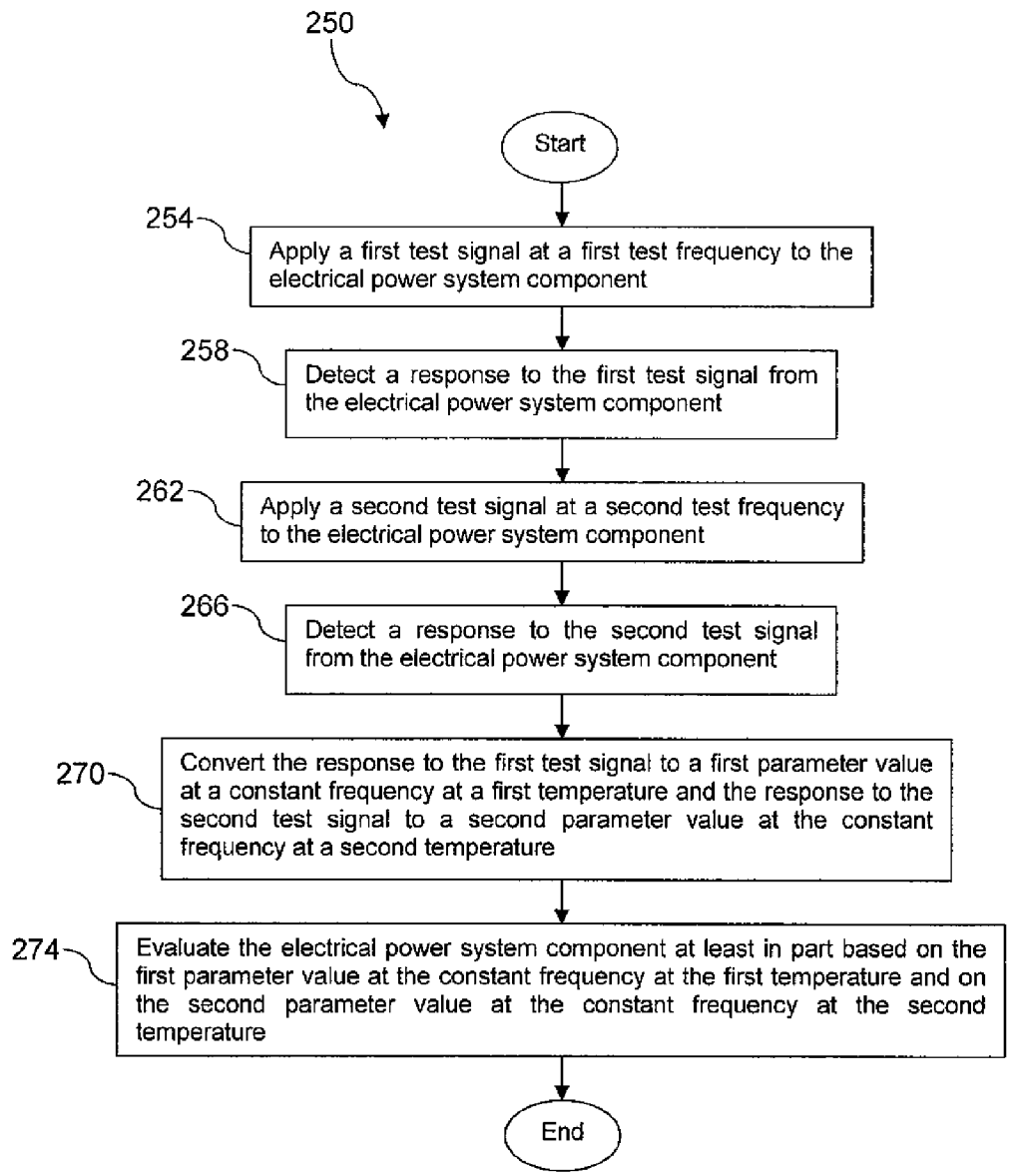
FIG. 4 is another flow diagram of a method of testing a power system component according to an embodiment of the disclosure.

Turning now to FIG. 4, a method 250 of testing an electrical power system component is described. At block 254, a first test signal at a first test frequency is applied to the electrical power system component, for example from the test set 100 to the first transformer 120-*a*. At block 258, a response of the electrical power system component to the first test signal, for example a voltage and a current, is detected by the test set 100. At block 262, a second test signal at a second test frequency is applied to the electrical power system component, for example from the test set 100 to the first transformer 120-*a*. At block 266, a response of the electrical power system component to the second test signal, for example a voltage and a current, is detected by the test set 100.

At block 270, the response to the first test signal is converted to a first parameter value, for example a first insulation power factor, at a constant frequency at a first temperature, and the response to the second test signal is converted to a second parameter value, for example a second insulation power factor, at a constant frequency at a second temperature. In an embodiment, the constant frequency may be about 60 Hz. In another embodiment, the constant frequency may be about 50 Hz. In an embodiment, an input of the test set 100 that promotes selecting one of a 60 Hz constant frequency and a 50 Hz constant frequency is provided. In general, the constant frequency is selected based on the line frequency of the subject power system. While 60 Hz power frequency is commonly used for power distribution in the Americas and 50 Hz power frequency is commonly used in the remainder of the world, other line frequencies are known. For example, a 16⅔ Hz power frequency is used in Germany, Austria, Switzerland, Sweden, and Norway for traction power networks for railways. A 25 Hz power frequency is used for some railway systems in Austria, New York, and Pennsylvania. A 400 Hz power frequency may be used in some aircraft electrical power applications. The present disclosure contemplates applying the present teachings to any power frequency.

At block 274, the electrical power system component is evaluated based at least in part on the first parameter value at the constant frequency at the first temperature and on the second parameter value at the constant frequency at the second temperature. For example, the electrical power system component may be evaluated based at least in part on the first insulation power factor at the constant frequency at the first temperature and on the second insulation power factor at the constant frequency at the second temperature. For example, the electrical power system component is evaluated to be within operational limits and designated for retesting in three months, six months, or some other effective time interval. In some cases, the action of block 274 may not be performed. Instead, the parameter versus temperature data set and/or function determined in block 270 may be used to understand and analyze the performance of the power system component, for example for simulation purposes, modeling purposes, and/or for other system analysis purposes.

Figure 5:
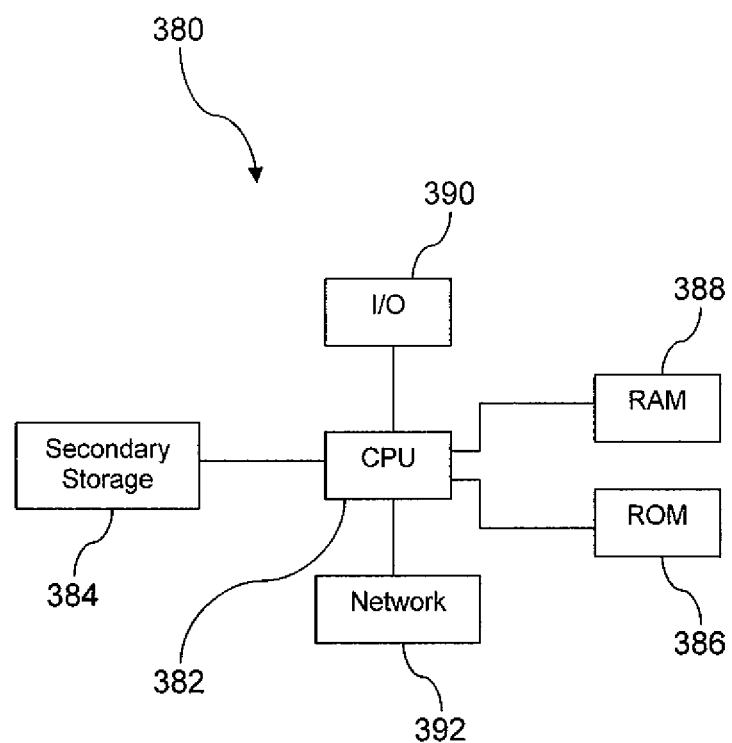
FIG. 5 illustrates an exemplary general purpose computer system suitable for implementing at least portions of the several embodiments of the disclosure.

Turning now to FIG. 5, a general-purpose computer system 380 is now discussed. Portions of the power system component test set 100 described above may be implemented using the general-purpose computer 380 with sufficient processing power, memory resources, and network throughput capability to handle the necessary workload placed upon it and with appropriate mechanical and electrical shielding to protect the general-purpose computer from the harsh environment of the power system field environment. The computer system 380 includes a processor 382 (which may be referred to as a central processor unit or CPU) that is in communication with memory devices including secondary storage 384, read only memory (ROM) 386, random access memory (RAM) 388, input/output (I/O) devices 390, and network connectivity devices 392. The processor may be implemented as one or more CPU chips.

The secondary storage 384 is typically comprised of one or more disk drives or tape drives and is used for non-volatile storage of data and as an over-flow data storage device if RAM 388 is not large enough to hold all working data. Secondary storage 384 may be used to store programs which are loaded into RAM 388 when such programs are selected for execution. The ROM 386 is used to store instructions and perhaps data which are read during program execution. ROM 386 is a non-volatile memory device which typically has a small memory capacity relative to the larger memory capacity of secondary storage. The RAM 388 is used to store volatile data and perhaps to store instructions. Access to both ROM 386 and RAM 388 is typically faster than to secondary storage 384.

I/O devices 390 may include printers, video monitors, liquid crystal displays (LCDs), touch screen displays, keyboards, keypads, switches, dials, mice, track balls, voice recognizers, card readers, paper tape readers, or other well-known input devices.

The network connectivity devices 392 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards such as code division multiple access (CDMA), global system for mobile communications (GSM), worldwide interoperability for microwave access (WiMAX), and/or industrial, scientific, medical (ISM) band radio transceiver cards, and other well-known network devices. These network connectivity devices 392 may enable the processor 382 to communicate with an Internet or one or more intranets. With such a network connection, it is contemplated that the processor 382 might receive information from the network, or might output information to the network in the course of performing the above-described method steps. Such information, which is often represented as a sequence of instructions to be executed using processor 382, may be received from and outputted to the network, for example, in the form of a computer data signal embodied in a carrier wave Such information, which may include data or instructions to be executed using processor 382 for example, may be received from and outputted to the network, for example, in the form of a computer data baseband signal or signal embodied in a carrier wave. The baseband signal or signal embodied in the carrier wave generated by the network connectivity devices 392 may propagate in or on the surface of electrical conductors, in coaxial cables, in waveguides, in optical media, for example optical fiber, or in the air or free space. The information contained in the baseband signal or signal embodied in the carrier wave may be ordered according to different sequences, as may be desirable for either processing or generating the information or transmitting or receiving the information. The baseband signal or signal embedded in the carrier wave, or other types of signals currently used or hereafter developed, referred to herein as the transmission medium, may be generated according to several methods well known to one skilled in the art.

The processor 382 executes instructions, codes, computer programs, scripts which it accesses from hard disk, floppy disk, optical disk (these various disk based systems may all be considered secondary storage 384), ROM 386, RAM 388, or the network connectivity devices 392. While only one processor 392 is shown, multiple processors may be present. Thus, while instructions may be discussed as executed by a processor, the instructions may be executed simultaneously, serially, or otherwise executed by one or multiple processors.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A method of testing a power system component, comprising:
coupling a test set to the power system component;
stimulating the power system component with a frequency sweep signal;

capturing a response of the power system component to the frequency sweep signal, wherein the response relates to frequency;

mapping the response to an estimated response, wherein the estimated response relates to temperature; and evaluating the power system component based on the estimated response.

2. The method of claim 1, further including storing the response and the estimated response on the test set.

3. The method of claim 1, wherein the power system component includes one of a power system transformer and a power system transformer bushing.

4. The method of claim 1, wherein the response comprises a insulation power factor as a dependent variable versus a frequency independent variable and the estimated response comprises the insulation power factor as a dependent variable versus the temperature independent variable.

5. The method of claim 1, wherein the estimated response is calibrated to a substantially constant frequency.

6. The method of claim 1, wherein the power system component is stimulated with a frequency sweep signal over frequency range from about 0.001 Hz to about 1000 Hz.

7. The method of claim 1, wherein mapping the response to an estimated response comprises calculating a parameter value of the power system component at a substantially constant temperature as a function of the frequency of the frequency sweep signal and calculating the parameter value of the power system component at a substantially constant frequency based on the parameter value of the power system component at a substantially constant temperature as a function of the frequency of the frequency sweep signal, according to a relationship including:

$$F_T \propto F_{TestTemperature} e^{-(K/T)}$$

where $F_T$ is the frequency at the variable temperature, $F_{TestTemperature}$ is the frequency at the test temperature, e is the natural logarithm, K is a constant of exponentiation, and T is the temperature being mapped to and where the parameter value is at least one of an insulation power factor, a dissipation factor, a capacitance, a permittivity, and a susceptibility.

8. The method of claim 7, wherein the relationship is further defined as $$F_T = F_{TestTemperature} e^{-(E_a/k)(1/T - 1/TestTemperature)}$$

where k is the Boltzman constant, $E_a$ is the activation energy, TestTemperature is the temperature at which the test was conducted.

9. A test set, comprising:
at least a first stimulator circuit to stimulate an electrical power system component with a frequency sweep signal, wherein the voltage of the frequency sweep signal is at a voltage of less than about 1,400 peak volts;

at least a first detector circuit to detect a response of the electrical power system component to the frequency sweep signal; and a test controller to convert the response to a mapping of a temperature to a parameter of the electrical power system component at a substantially constant frequency and to evaluate the power system component based on the mapping of the temperature to the parameter, where the parameter is at least one of an insulation power factor, a dissipation factor, a capacitance, a permittivity, and a susceptibility.

10. The test set of claim 9, further including an interface to display the parameter of the electrical power system component as a dependent variable versus temperature as an independent variable based on the mapping of the temperature to the insulation power factor.

11. The test set of claim 9, wherein the constant frequency is one of about 50 Hz and about 60 Hz.

12. The test set of claim 9, wherein the constant frequency is one of about 16 ⅔ Hz and about 25 Hz.

13. The test set of claim 9, wherein converting the response to a mapping of a temperature to the parameter comprises calculating the parameter at a substantially constant temperature as a function of the frequency of the frequency sweep signal based on the response and calculating the parameter at a substantially constant frequency based on the parameter at a substantially constant temperature as a function of the frequency of the frequency sweep signal, according to a relationship including:

$$F_T \propto F_{TestTemperature} e^{-(K/T)}$$

where $F_T$ is the frequency at the variable temperature, $F_{TestTemperature}$ is the frequency at the test temperature, e is the natural logarithm, K is a constant of exponentiation, and T is the temperature being mapped to.

14. The test set of claim 13, wherein the relationship is further defined as $$F_T = F_{TestTemperature} e^{-(E_a/k)(1/T - 1/TestTemperature)}$$

where k is the Boltzman constant, $E_a$ is the activation energy, TestTemperature is the temperature at which the test was conducted.

15. The test set of claim 14, wherein the value of $E_a$ is in the range from about 0.4 eV and about 1.5 eV.

16. A method of testing a power system component, comprising:
applying a first test signal at a first test frequency to the power system component;

detecting a response to the first test signal from the power system component;

applying a second test signal at a second test frequency to the power system component;

detecting a response to the second test signal from the power system component;

converting the response to the first test signal to a first parameter of the power system component at a substantially constant frequency at a first temperature and the response to the second test signal to a second parameter at the substantially constant frequency at a second temperature; and evaluating the power system component at least in part based on the first parameter at the substantially constant frequency at the first temperature and on the second parameter at the substantially constant frequency at the second temperature, wherein the parameter is at least one of an insulation power factor, a dissipation factor, a capacitance, a permittivity, and a susceptibility.

17. The method of claim 16, wherein the substantially constant frequency is in the range of about 50 Hz to about 60 Hz.

18. The method of claim 16, wherein the first test signal and the second test signal are less than about 200 peak volts in voltage.

19. The method of claim 16, wherein the power system component is one of an electrical power distribution transformer and an electrical power distribution transformer bushing.

20. The method of claim 16, wherein evaluating the power system component comprises one of determining the power system component is ready for duty and determining the power system component is not ready for duty.

* * * * *